United States Patent
Ko et al.

(10) Patent No.: US 8,268,184 B2
(45) Date of Patent: Sep. 18, 2012

(54) ETCH PROCESS FOR REDUCING SILICON RECESS

(75) Inventors: Akiteru Ko, Schenectady, NY (US); Christopher Cole, West Charlton, NY (US)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 12/826,488

(22) Filed: Jun. 29, 2010

(65) Prior Publication Data
US 2011/0318936 A1 Dec. 29, 2011

(51) Int. Cl.
*B44C 1/22* (2006.01)
(52) U.S. Cl. ............ 216/67; 216/37; 438/703; 438/706; 438/709; 438/710; 257/369; 257/E29.345
(58) Field of Classification Search .................... 216/37, 216/67; 438/703, 706, 709, 710, 723
See application file for complete search history.

(56) References Cited

U.S. PATENT DOCUMENTS

| | | | |
|---|---|---|---|
| 5,318,668 A | 6/1994 | Tamaki et al. | |
| 5,352,617 A | 10/1994 | Miwa | |
| 5,888,337 A | 3/1999 | Saito | |
| 6,093,627 A | 7/2000 | Sung | |
| 6,524,938 B1 | 2/2003 | Tao et al. | |
| 6,624,480 B2 | 9/2003 | Lin et al. | |
| 6,805,139 B1 | 10/2004 | Savas et al. | |
| 6,842,658 B2 | 1/2005 | Izawa et al. | |
| 6,890,863 B1 | 5/2005 | Donohoe et al. | |
| 7,008,878 B2 | 3/2006 | Hsu et al. | |
| 7,393,788 B2 | 7/2008 | Cook | |
| 7,422,637 B2 * | 9/2008 | Ku et al. ...................... 118/728 |
| 2004/0063328 A1 | 4/2004 | Wen et al. | |
| 2005/0009283 A1 | 1/2005 | Chiu et al. | |
| 2005/0136680 A1 | 6/2005 | Hsu et al. | |
| 2005/0164503 A1 | 7/2005 | Chan et al. | |
| 2006/0016559 A1 | 1/2006 | Kobayashi et al. | |
| 2006/0032585 A1 | 2/2006 | Kai et al. | |
| 2007/0032081 A1 | 2/2007 | Chang et al. | |
| 2007/0059938 A1 | 3/2007 | Kida et al. | |
| 2007/0190792 A1* | 8/2007 | Cook ............................ 438/706 |
| 2009/0032880 A1* | 2/2009 | Kawaguchi et al. ........... 257/369 |

FOREIGN PATENT DOCUMENTS

| | | |
|---|---|---|
| EP | 0908940 A2 | 4/1999 |
| WO | 2007040716 A2 | 4/2007 |

OTHER PUBLICATIONS

International Searching Authority/US , International Search Report and Written Opinion issued in corresponding Application PCT/US11/39226 dated Sep. 23, 2011, 10 pp.

* cited by examiner

*Primary Examiner* — Lan Vinh
*Assistant Examiner* — Maki Angadi
(74) *Attorney, Agent, or Firm* — Wood, Herron & Evans, LLP

(57) ABSTRACT

A method for selectively etching a substrate is described. The method includes disposing a substrate comprising a silicon nitride ($SiN_y$) layer overlying silicon in a plasma etching system, and transferring a pattern to the silicon nitride layer using a plasma etch process, wherein the plasma etch process utilizes a process composition having as incipient ingredients a process gas containing C, H and F, and an additive gas including $CO_2$. The method further includes: selecting an amount of the additive gas in the plasma etch process to achieve: (1) a silicon recess formed in the silicon having a depth less than 10 nanometers (nm), and (2) a sidewall profile in the pattern having an angular deviation from 90 degrees less than 2 degrees.

20 Claims, 17 Drawing Sheets

ETCH PROCESS FOR REDUCING SILICON RECESS

CROSS REFERENCE TO RELATED APPLICATIONS

The present invention is related to U.S. patent application Ser. No. 11/226,452, entitled "METHOD AND SYSTEM FOR ETCHING SILICON OXIDE AND SILICON NITRIDE WITH HIGH SELECTIVITY RELATIVE TO SILICON", filed on Sep. 15, 2005, and now abandoned; and U.S. patent application Ser. No. 11/350,765, entitled "METHOD AND SYSTEM FOR SELECTIVELY ETCHING A DIELECTRIC MATERIAL RELATIVE TO SILICON", filed on Feb. 10, 2006, and now issued as U.S. Pat. No. 7,393,788; the entire contents of which are herein incorporated by reference.

BACKGROUND OF THE INVENTION

1. Field of Invention

The present invention relates to a method and system for selectively etching dielectric materials, and more particularly to a method and system for uniformly etching silicon oxide ($SiO_x$) or silicon nitride ($SiN_y$) with high selectivity relative to silicon using a plasma etch process that achieves an anisotropic etch profile with reduced silicon recess.

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while substantially not etching another material.

For example, on a semiconductor substrate, a pattern formed in a protective layer can be transferred to an underlying layer of a selected material utilizing a plasma etching process. The protective layer can comprise a light-sensitive layer, such as a photoresist layer, having a pattern formed using a lithographic process.

Once the pattern is formed, the semiconductor substrate is disposed within a plasma processing chamber, and an etching chemistry is formed that selectively etches the underlying layer while minimally etching the protective layer. This etch chemistry is produced by introducing an ionizable, dissociative gas mixture having parent molecules comprising molecular constituents capable of reacting with the underlying layer while minimally reacting with the protective layer. The production of the etch chemistry comprises introduction of the gas mixture and formation of plasma when a portion of the gas species present are ionized following a collision with an energetic electron. Moreover, the heated electrons serve to dissociate some species of the gas mixture and create a reactive mixture of chemical constituents (of the parent molecules).

Thereafter, the ionized gas species and reactive mixture of chemical constituents facilitate the etching of various features (e.g., trenches, vias, contacts, etc.) in the exposed regions of substrate. Such substrate materials where etching is required include silicon dioxide ($SiO_2$), silicon nitride ($Si_3N_4$), poly-crystalline silicon (polysilicon), and mono-crystalline silicon (silicon), for example.

SUMMARY OF THE INVENTION

The present invention relates to a method and system for selectively etching dielectric materials, and more particularly to a method and system for uniformly etching silicon oxide ($SiO_x$) or silicon nitride ($SiN_y$) with high selectivity relative to silicon using a plasma etch process that achieves an anisotropic etch profile with reduced silicon recess.

According to one embodiment, a method for selectively etching a substrate is described. The method includes disposing a substrate comprising a silicon nitride ($SiN_y$) layer overlying silicon in a plasma etching system, and transferring a pattern to the silicon nitride layer using a plasma etch process, wherein the plasma etch process utilizes a process gas composition having as incipient ingredients a process gas containing C, H and F, and an additive gas including $CO_2$. The method further includes: selecting an amount of the additive gas in the plasma etch process to achieve: (1) a silicon recess formed in the silicon having a depth less than 10 nanometers (nm), and (2) a sidewall profile in the pattern having an angular deviation from 90 degrees less than 2 degrees.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
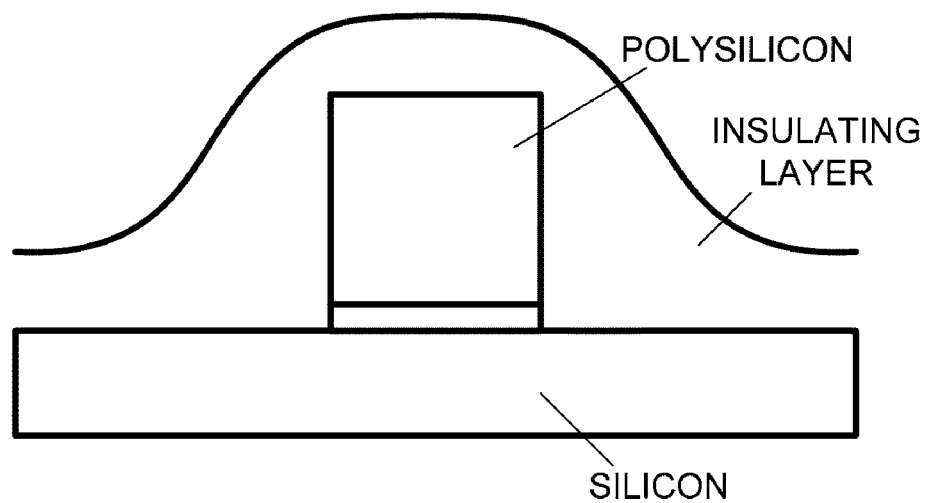
FIGS. 1A and 1B show a schematic representation of a structure formed on a silicon substrate.

In material processing methodologies, dry plasma etching utilizes a plasma chemistry having chemical reactants suitable for selectively etching one material while substantially not etching another material. In one example, a layer of insulating (dielectric) material is deposited over a gate stack having a poly-crystalline silicon (polysilicon) feature, see FIG. 1A. For example, the insulating layer may comprise silicon oxide (e.g., $SiO_x$), or silicon nitride (e.g., $SiN_y$), or both.

Figure 1B:
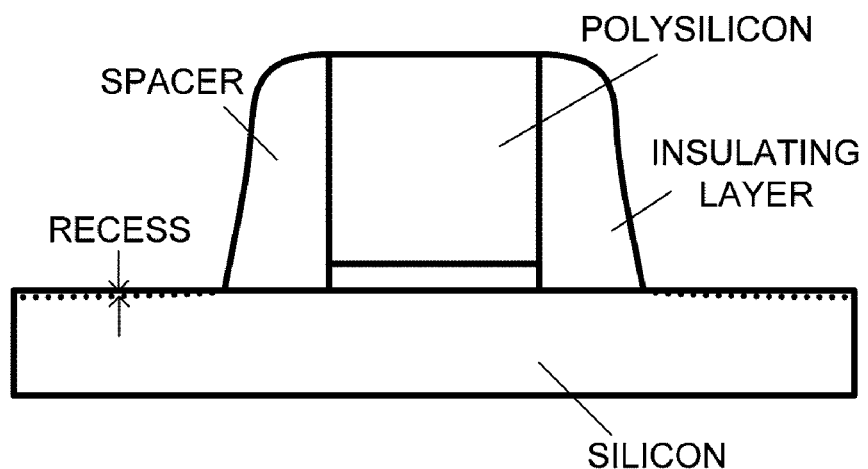

Thereafter, the insulating layer is subjected to a plasma etch process, wherein the insulating layer is removed in all locations except along the sidewalls of the gate stack; see FIG. 1B. The remaining insulating material acts as a spacer in the fabrication of the semiconductor device. It is important for device operation and/or reliability that the spacer be formed without substantially reducing the polysilicon gate material and while minimizing a recess (FIG. 1B) formed in the silicon substrate. Furthermore, it is important to meet the aforementioned conditions while achieving an anisotropic profile.

Thus, an etch chemistry is preferably chosen to etch the insulating material while minimally etching the underlying (mono-crystalline) silicon substrate, as well as minimally etching the polysilicon. Furthermore, it is important for manufacturing yields, for example, that the results of the spacer etch process are uniform across the extent of the substrate. As described above, the plasma etch process must perform according to rigid specifications to achieve properly dimensioned, robust electrical structures in the IC. Other applications are also contemplated including contact align and dual stress liner formation.

Figure 2:
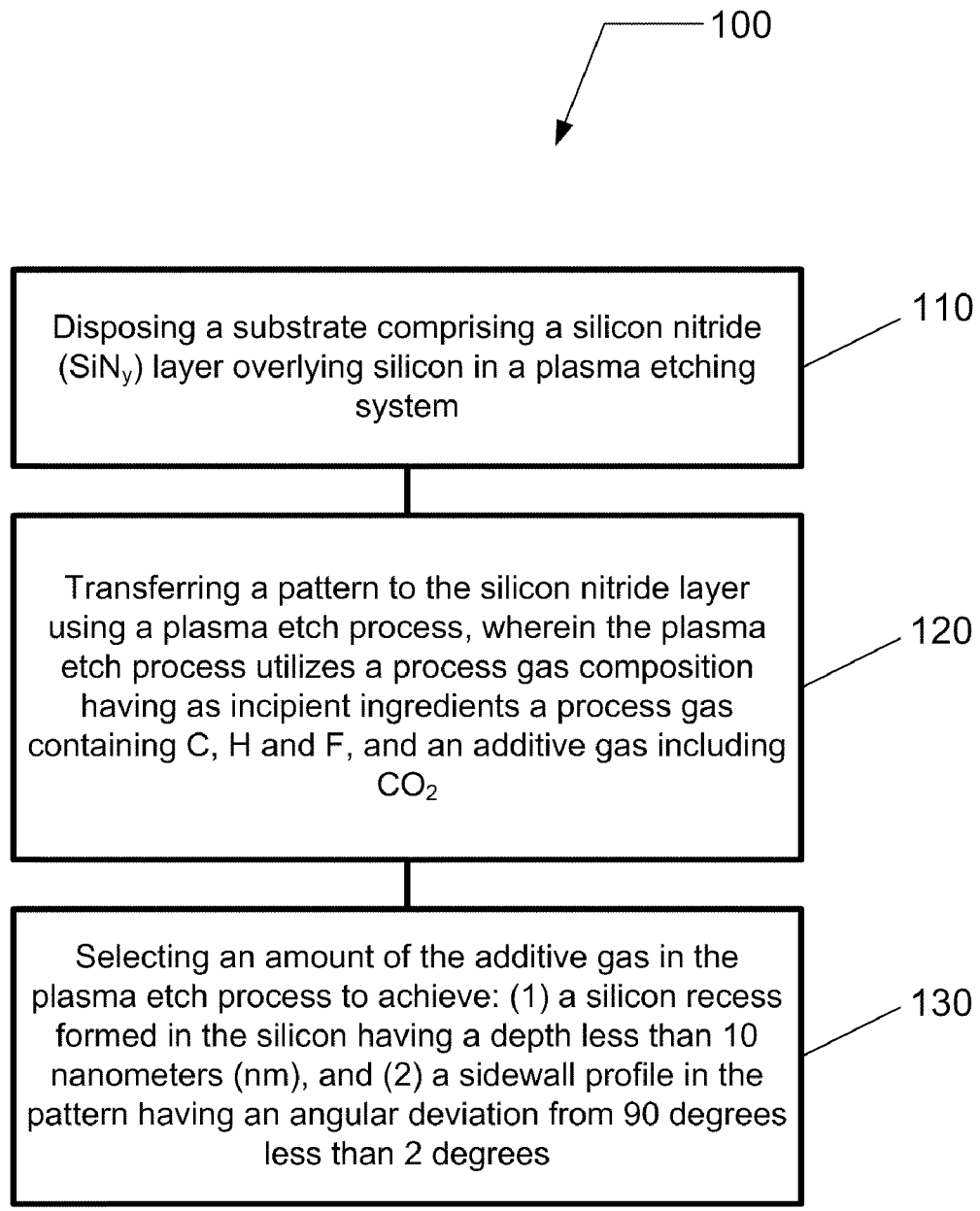
FIG. 2 provides a flow chart illustrating a method of selectively etching a substrate according to an embodiment.
Figure 3:
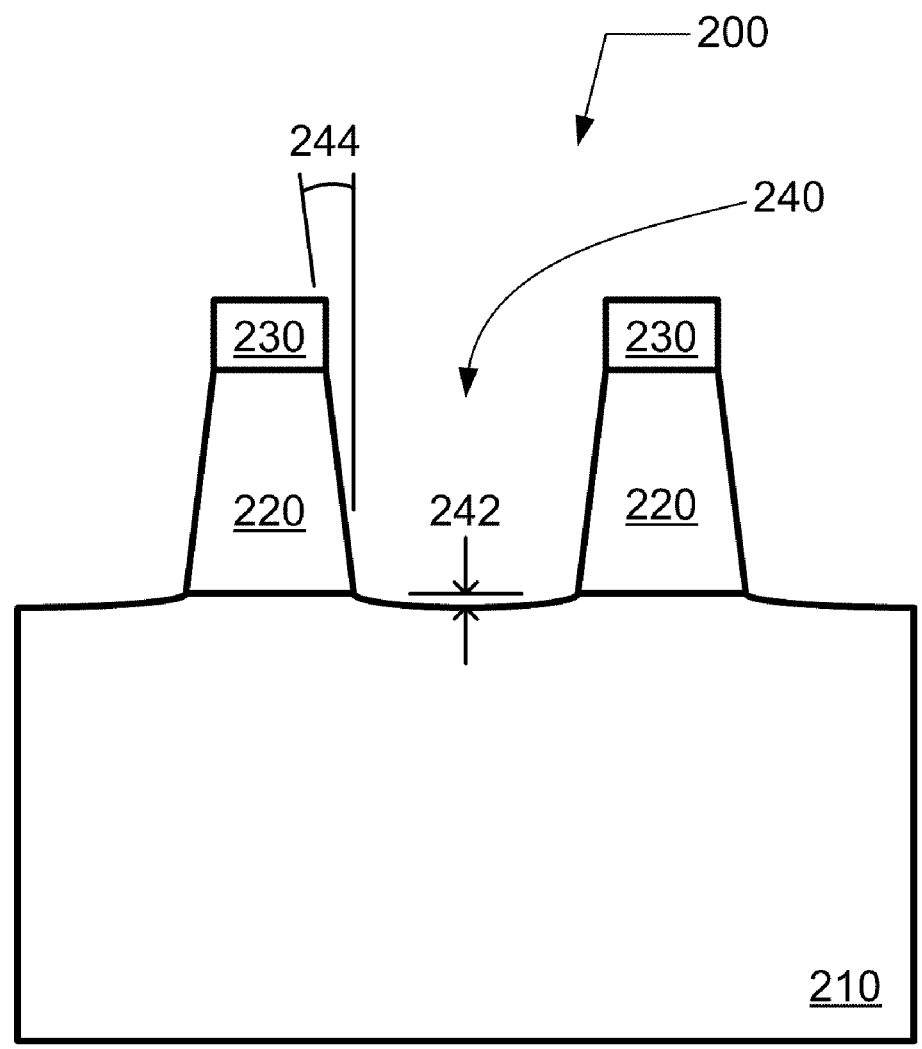
FIG. 3 provides a schematic illustration of a pattern formed in a layer on a substrate according to another embodiment.

Accordingly, in one embodiment a method and system for selectively and uniformly etching silicon oxide ($SiO_x$) and/or silicon nitride ($SiN_y$) with respect to silicon and polysilicon in a plasma etching system are described. As illustrated in FIGS. 2 and 3, the method includes a flow chart 100 beginning in 110 with disposing a substrate 210 comprising a silicon nitride ($SiN_y$) layer 220 overlying silicon in a plasma etching system. The substrate 210 further comprises a patterned mask layer 230 having one or more layers (e.g., lithographic mask layer, soft mask layer, hard mask layer, anti-reflective coating (ARC), organic planarization layer (OPL), etc.).

In 120 and as shown in FIG. 3, a pattern 240 is transferred to the silicon nitride layer 220 using a plasma etch process, wherein the plasma etch process utilizes a process gas composition having as incipient ingredients a process gas containing C, H and F, and an additive gas including $CO_2$. As an example, the process gas containing C, H and F may include $CHF_3$, $CH_3F$, $CH_2F_2$, or any combination of two or more thereof. As another example, the process gas containing C, H and F may include $CHF_3$. As another example, the process gas containing C, H and F may consist of $CHF_3$. The process gas composition may further include a noble gas, such as He, Ne, Ar, Kr, or Xe. Additionally, the process gas composition may further include an oxygen-containing gas, such as oxygen ($O_2$), CO, NO, $N_2O$, or $NO_2$, or any combination thereof. As yet another example, the process gas composition may comprise $CHF_3$, $CO_2$, and Ar. As even yet another example, the process gas composition may consist of $CHF_3$, $CO_2$, and Ar.

Furthermore, in 130 and as shown in FIG. 3, an amount of the additive gas in the plasma etch process is selected to achieve: (1) a silicon recess 242 formed in the silicon having a depth less than 10 nanometers (nm), and (2) a sidewall profile in the pattern 240 having an angular deviation 244 from 90 degrees less than 2 degrees. Alternatively, the silicon recess 242 formed in the silicon has a depth less than 8 nanometers (nm), and the angular deviation 244 from 90 degrees is less than 1 degree.

As described above, the process gas composition comprises use of a gas collectively containing C, H and F, or fluorohydrocarbons, such as $CH_2F_2$ and $CHF_3$. High etch selectivity and acceptable uniformity can be achieved by selecting a process condition, including a pressure, a flow rate of $CHF_3$, and a radio frequency (RF) power coupled to the plasma etching system, such that a proper balance of active etching molecules or atoms, and polymer forming molecules are formed within the etching plasma.

For example, it is believed by the inventors that the use of an etch chemistry collectively containing C, H and F promotes the formation of hydrocarbon and fluorocarbon molecules in the presence of the etching plasma that may adsorb on polysilicon and silicon surfaces and protect these surfaces during the etching process, while permitting the etching of silicon oxide or silicon nitride surfaces. An etch chemistry collectively containing C, H and F may produce a balance of actively etching molecules or atoms and polymer forming molecules. The protective nature of this chemistry; however, may be detrimental to the etch profile and degrade the anisotropy of the plasma etch process. Therefore, the additive gas including $CO_2$ is introduced to improve anisotropy, while maintaining reduced silicon recess formation (to be discussed below). The inventors explored oxygen ($O_2$); however, $O_2$ addition was found to substantially degrade the protective nature of the etch chemistry and cause unacceptable silicon recess.

To achieve an anisotropic etch profile with reduced silicon recess, a flow rate of the process gas containing C, H and F is selected to range from about 10 sccm (standard cubic centimeters per minute) to about 50 sccm, and a flow rate of the additive gas is selected to range from about 1 sccm to about 10 sccm. The pressure in the plasma etching system is selected to range from 1 mTorr (milli-Torr) to 200 mTorr, e.g., 30 mTorr to 60 mTorr.

In one embodiment, a ratio between a flow rate of the additive gas and a flow rate of the process gas containing C, H and F is selected to range from 5% to 25%. In another embodiment, a ratio between a flow rate of the additive gas and a flow rate of the process gas containing C, H and F is selected to range from 10% to 20%. In another embodiment, a ratio between a flow rate of the additive gas and a flow rate of the process gas containing C, H and F is selected to range from 15% to 20%. In yet another embodiment, a ratio between a flow rate of the $CO_2$ and a flow rate of $CHF_3$ is selected to range from 15% to 20%.

As will be described in greater detail below, the substrate temperature may be controlled according to a temperature control scheme using a temperature controlled substrate holder in the plasma etching system. Using the temperature controlled substrate holder in the plasma etching system, the substrate temperature may be spatially and temporally controlled to improve the plasma etch process.

The temperature controlled substrate holder may comprise a support base having fluid channels to circulate a temperature controlled thermal fluid in the support base, and a substrate support coupled via a thermal insulator to an upper portion of the support base. The substrate support further comprises one or more heating elements embedded within the substrate support, an upper surface to support the substrate by contact between the upper surface and a backside of the substrate, and an electrostatic clamp electrode to hold the substrate on the upper surface of the substrate support. The one or more heating elements may comprise a first heating element located at a substantially central region of the substrate and a second heating element located at a substantially edge region of the substrate, wherein the first heating element and the second heating element are concentrically arranged.

Additionally, the temperature controlled substrate holder may include a backside gas supply system configured to supply a heat transfer gas to the backside of the substrate through at least one of a plurality of orifices or channels disposed on the upper surface of the substrate support. The orifices of the backside gas supply system may be arranged in a plurality of zones on the upper surface of the substrate support to vary a backside pressure in a radial direction between a substantially central region of the backside of the substrate and a substantially edge region of the backside of the substrate. For example, the plurality of zones for controlling the supply of heat transfer gas to the backside of the substrate may correspond to the regions where the first and second heating elements are located.

The process pressure may be varied during the plasma etch process. Additionally, during the plasma etch process, power for generating plasma may be varied, or it may be kept constant. Furthermore, the plasma etch process may proceed for a time duration sufficient to etch partially or fully through the silicon nitride layer 220 in the film stack. The time duration may be determined in-situ using endpoint detection or it may be determined prior to performing each plasma etch process. To address etch uniformity, etch profile control, and/or critical dimension (CD) control, the duration of the plasma etch process may be extended by an over-etch process.

The plasma etch process described above may be performed utilizing a plasma etching system such as the one described in FIGS. 4 through 11. Furthermore, the plasma etch process described above may be performed utilizing a temperature controlled substrate holder in a plasma etching system such as the one described in FIG. 12.

Figure 4:
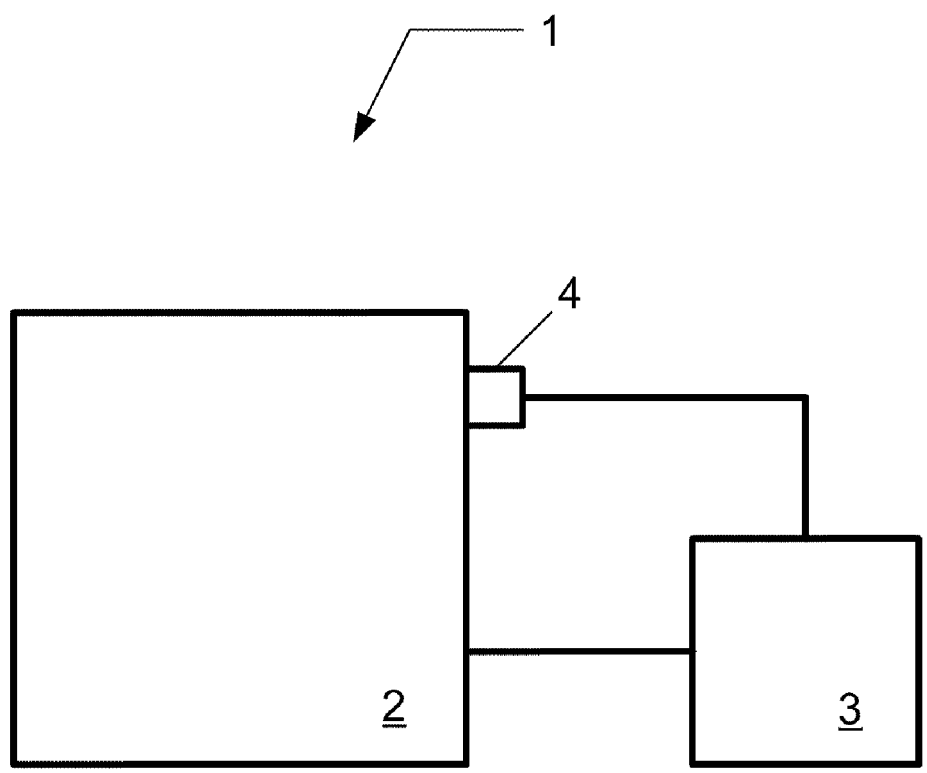
FIG. 4 shows a schematic representation of a plasma etching system according to an embodiment.

According to one embodiment, a plasma etching system 1 is depicted in FIG. 4 comprising a plasma processing chamber 2, a diagnostic system 3 coupled to the plasma processing chamber 2, and a controller 4 coupled to the diagnostic system 3 and the plasma processing chamber 2.

The controller 4 is configured to execute a process recipe comprising a process gas composition having as incipient ingredients a process gas containing C, H and F, and an additive gas including $CO_2$ to selectively and uniformly etch silicon oxide or silicon nitride relative to silicon and/or polysilicon. Alternatively, the controller 4 is configured to execute a process recipe comprising trifluoromethane ($CHF_3$), carbon dioxide ($CO_2$), and a noble gas to selectively etch silicon oxide or silicon nitride relative to silicon and/or polysilicon. Additionally, controller 4 is configured to receive at least one endpoint signal from the diagnostic system 3 and to post-process the at least one endpoint signal in order to accurately determine an endpoint for the plasma etch process. In the illustrated embodiment, plasma etching system 1, depicted in FIG. 4, utilizes plasma for material processing.

Figure 5:
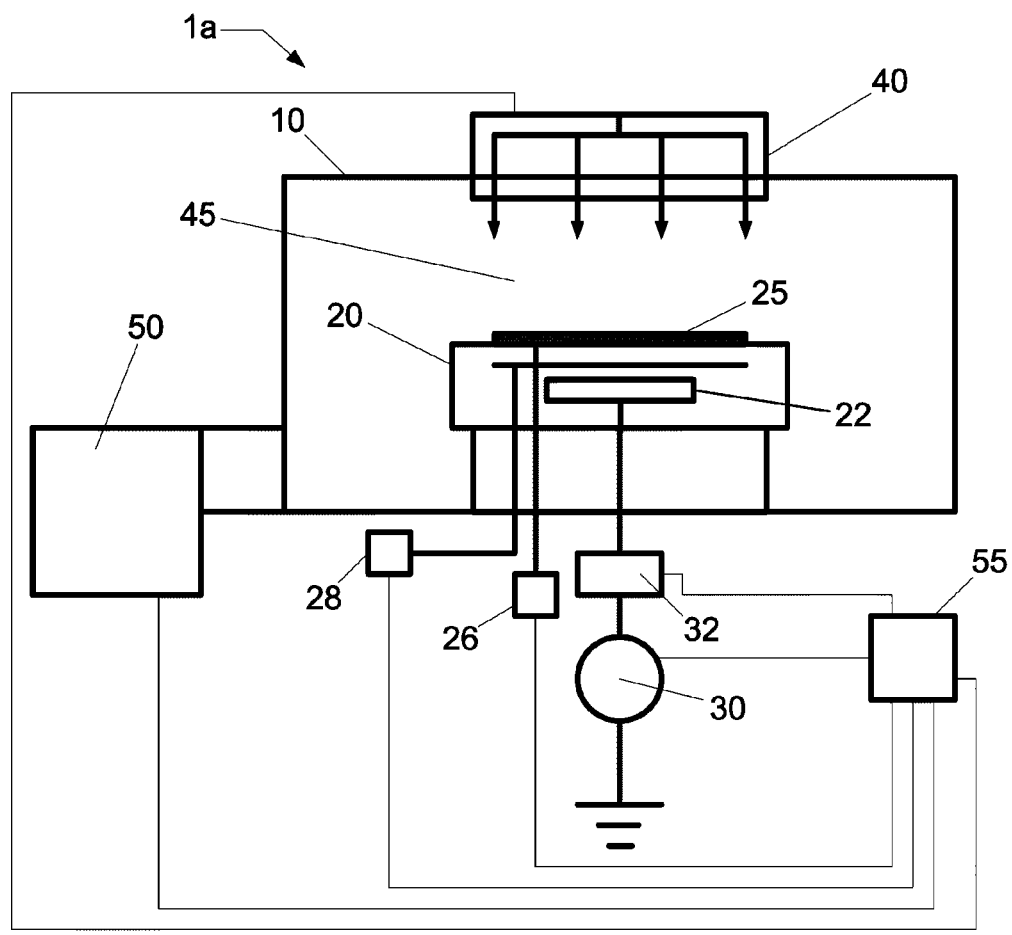
FIG. 5 shows a schematic representation of a plasma etching system according to another embodiment.

According to another embodiment, a plasma etching system 1a configured to perform the above identified process conditions is depicted in FIG. 5 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma etching system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma etching system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 5, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10.

Controller 55 comprises a microprocessor, memory, and a digital I/O port capable of generating control voltages sufficient to communicate and activate inputs to plasma etching system 1a as well as monitor outputs from plasma etching system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma etching system 1a according to a process recipe in order to perform a plasma assisted process on substrate 25.

Controller 55 can be locally located relative to the plasma etching system 1a, or it can be remotely located relative to the plasma etching system 1a. For example, controller 55 can exchange data with plasma etching system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 6, plasma etching system 1b can be similar to the embodiment of FIG. 5 and further comprise either a stationary, or mechanically or electrically rotating magnetic field system 60, in order to potentially increase plasma density and/or improve plasma processing uniformity, in addition to those components described with reference to FIG. 5. Moreover, controller 55 can be coupled to magnetic field system 60 in order to regulate the speed of rotation and field strength. The design and implementation of a rotating magnetic field is well known to those skilled in the art.

Figure 6:
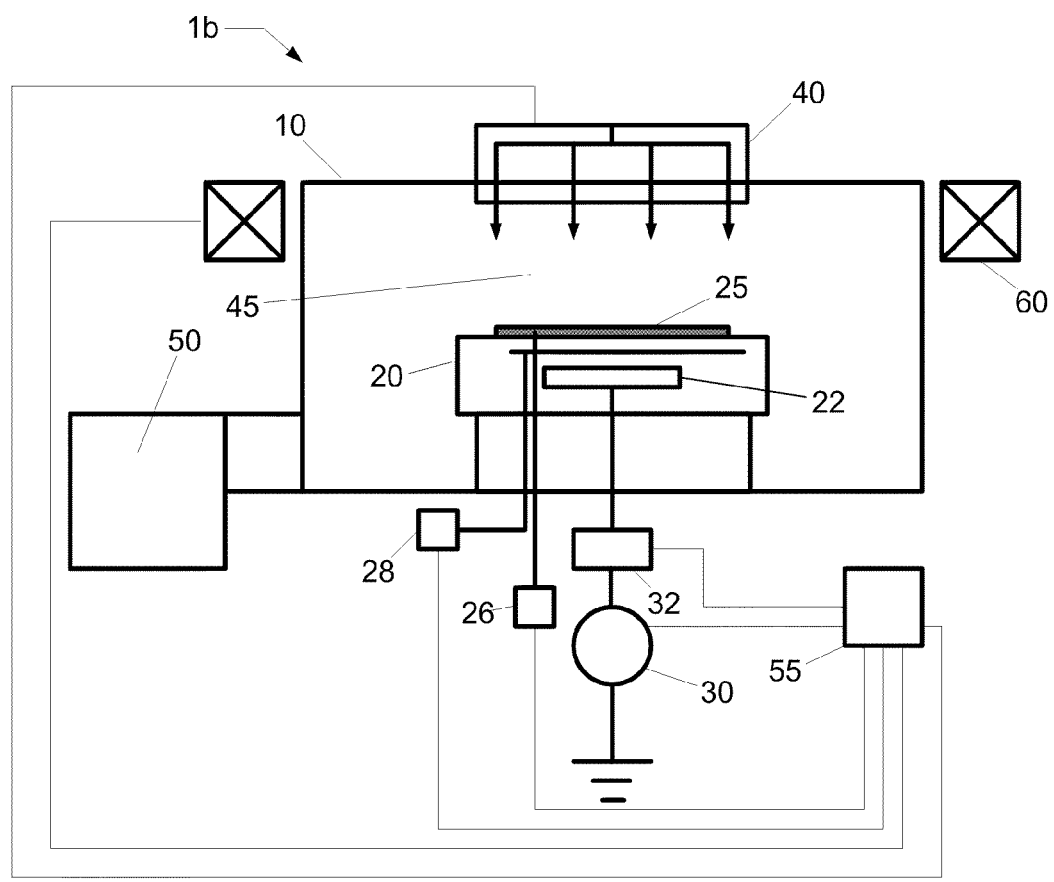
FIG. 6 shows a schematic representation of a plasma etching system according to another embodiment.
Figure 7:
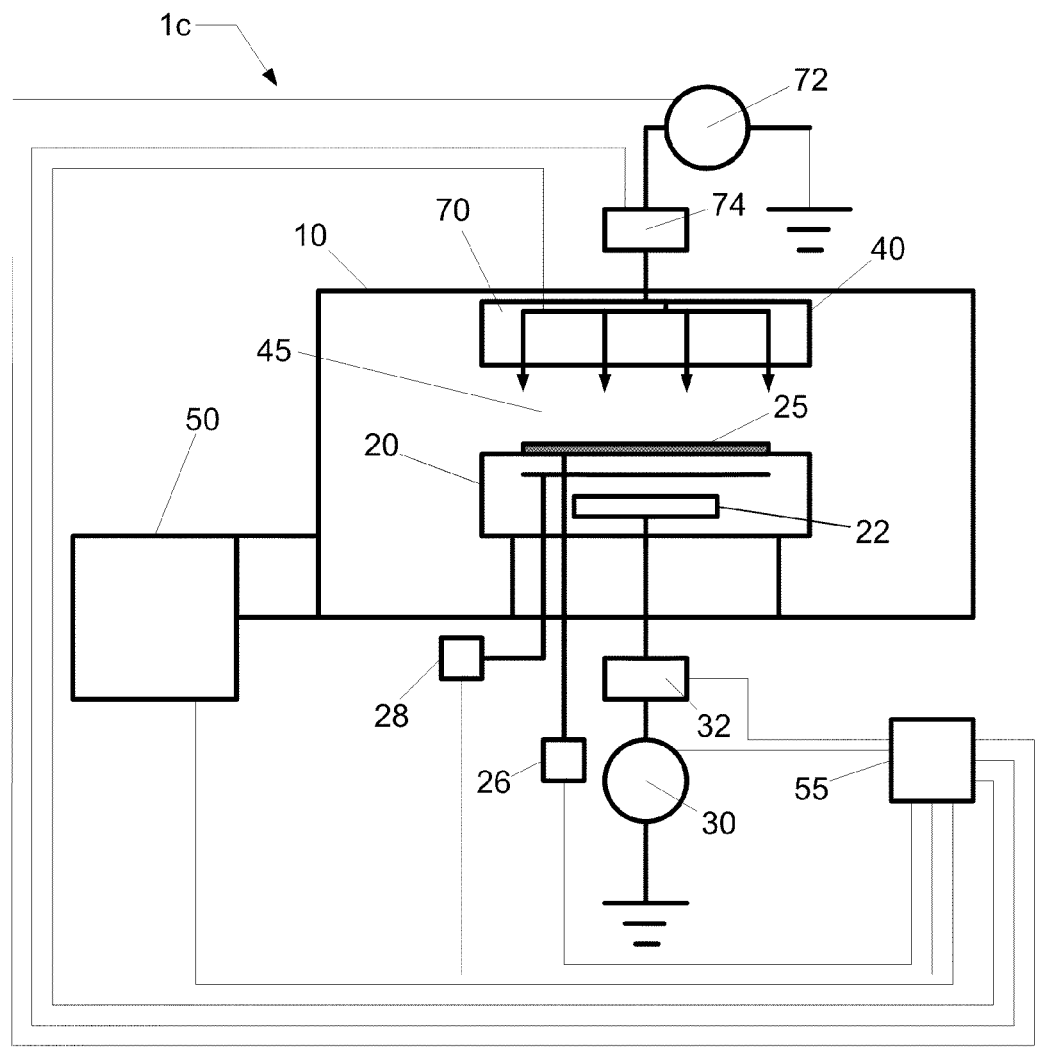
FIG. 7 shows a schematic representation of a plasma etching system according to another embodiment.

In the embodiment shown in FIG. 7, plasma etching system 1c can be similar to the embodiment of FIG. 5 or FIG. 6, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 8:
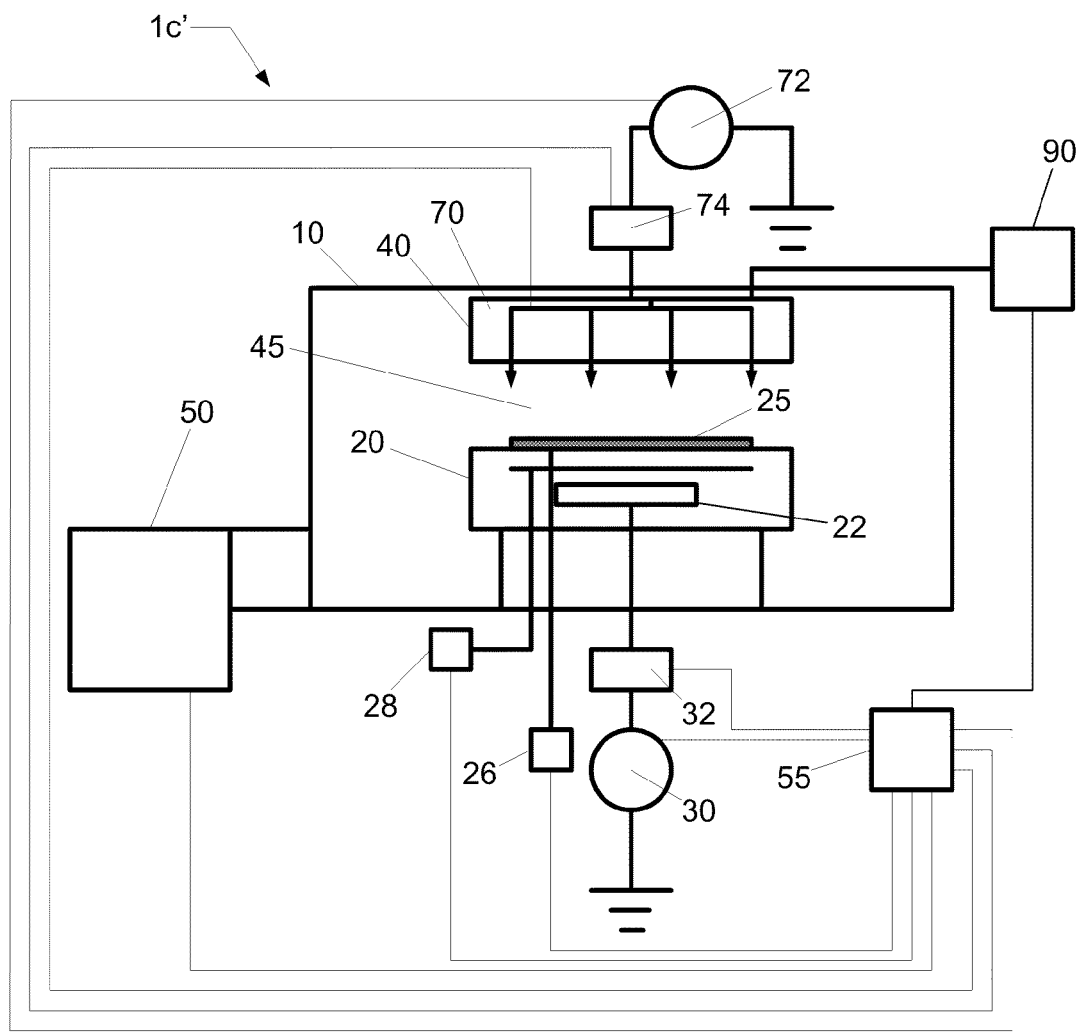
FIG. 8 shows a schematic representation of a plasma etching system according to another embodiment.

In the embodiment shown in FIG. 8, plasma etching system 1c' can be similar to the embodiment of FIG. 7, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 9:
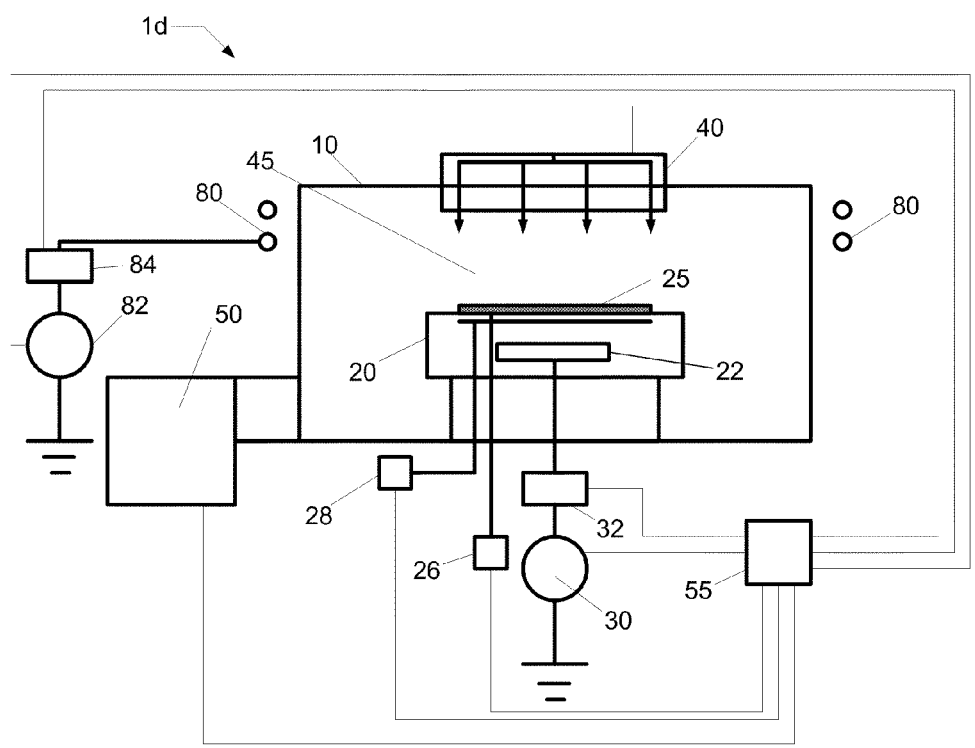
FIG. 9 shows a schematic representation of a plasma etching system according to another embodiment.

In the embodiment shown in FIG. 9, plasma etching system 1d can be similar to the embodiments of FIGS. 5 and 6, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 10:
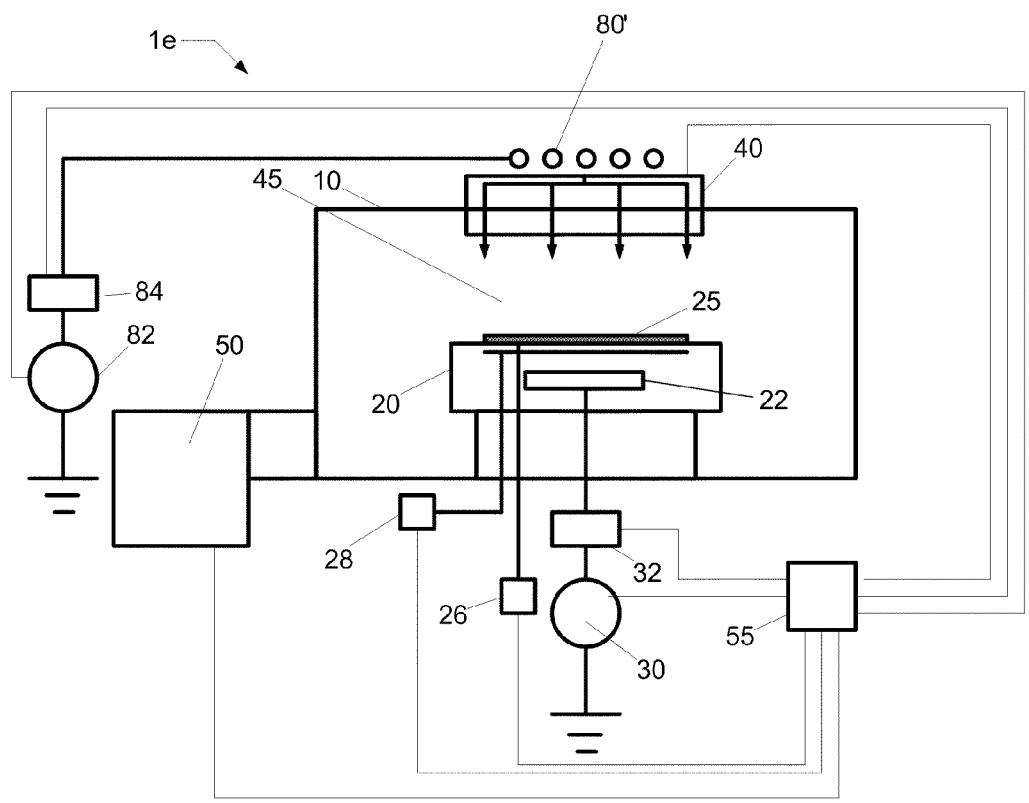
FIG. 10 shows a schematic representation of a plasma etching system according to another embodiment.

In an alternate embodiment, as shown in FIG. 10, plasma etching system 1e can be similar to the embodiment of FIG. 9, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
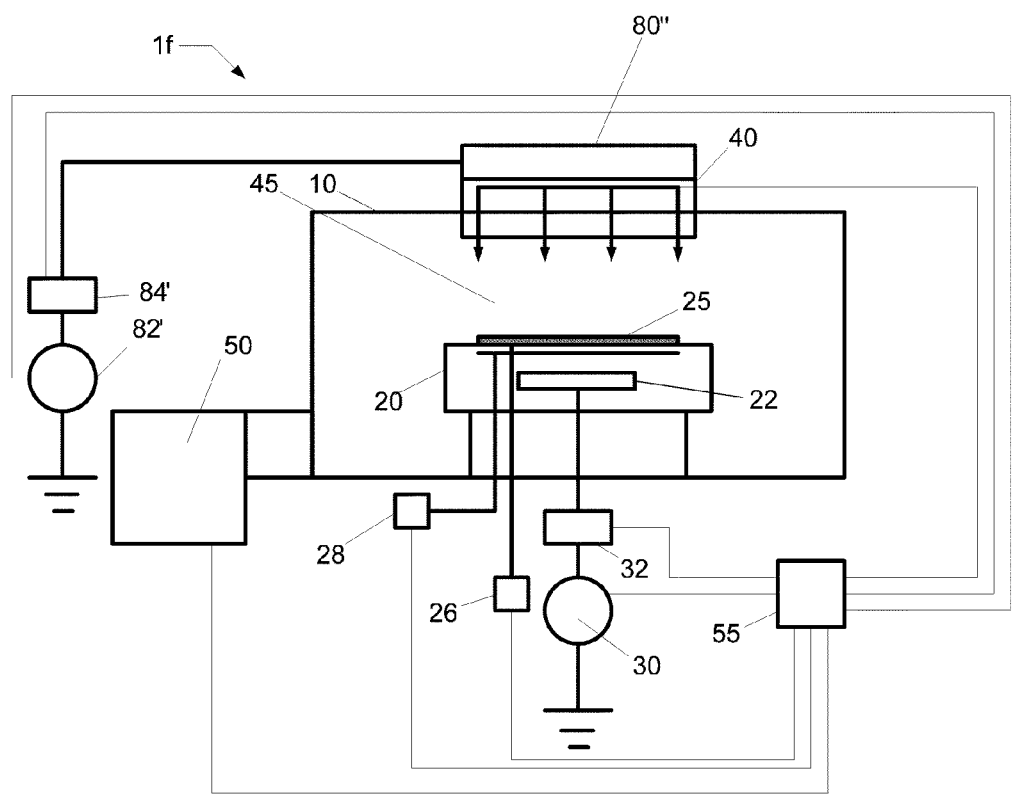
FIG. 11 shows a schematic representation of a plasma etching system according to another embodiment.

In the embodiment shown in FIG. 11, plasma etching system if can be similar to the embodiment of FIG. 5, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

Figure 12:
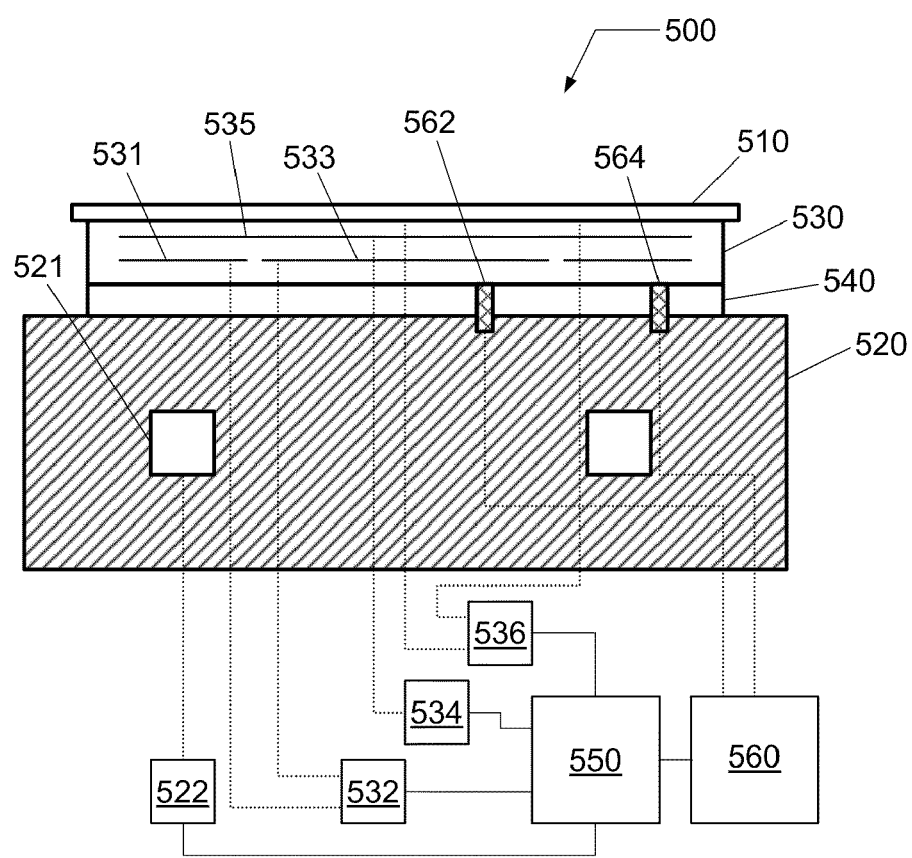
FIG. 12 shows a schematic representation of a substrate holder for use in a plasma etching system according to yet another embodiment.

Referring now to FIG. 12, a temperature controlled substrate holder 500 for use in any one of the plasma etching systems depicted in FIGS. 4 through 11 is described according to yet another embodiment. The substrate holder 500 comprises a substrate support 530 having a first temperature and configured to support a substrate 510, a temperature-controlled support base 520 positioned below substrate support 530 and configured to be at a second temperature less than the first temperature (e.g. less than a desired temperature of substrate 510), and a thermal insulator 540 disposed between the substrate support 530 and the temperature-controlled support base 520. Additionally, the substrate support 530 comprises a center heating element 533 (located at a substantially center region below substrate 510) and an edge heating element 531 (located at a substantially edge, or peripheral, region below substrate 510) coupled thereto, and configured to elevate the temperature of the substrate support 530. Furthermore, the support base 520 comprises one or more cooling elements 521 coupled thereto, and configured to reduce the temperature of the substrate support 530 via the removal of heat from the substrate support 530 through thermal insulator 540.

As shown in FIG. 12, the center heating element 533 and the edge heating element 531 are coupled to a heating element control unit 532. Heating element control unit 532 is configured to provide either dependent or independent control of each heating element, and exchange information with a controller 550. The center heating element 533 and the edge heating element 531 may comprise at least one of a heating fluid channel, a resistive heating element, or a thermo-electric element biased to transfer heat towards the wafer.

For example, the center heating element 533 and the edge heating element 531 may comprise one or more heating channels that can permit flow of a fluid, such as water, FLUORINERT, GALDEN HT-135, etc., there through in order to provide conductive-convective heating, wherein the fluid temperature has been elevated via a heat exchanger. The fluid flow rate and fluid temperature can, for example, be set, monitored, adjusted, and controlled by the heating element control unit 532.

Alternatively, for example, the center heating element 533 and the edge heating element 531 may comprise one or more resistive heating elements such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). For example, the heating elements can comprise a cast-in heater commercially available from Watlow (1310 Kingsland Dr., Batavia, Ill., 60510) capable of a maximum operating temperature of 400 to 450 degrees C., or a film heater comprising aluminum nitride materials that is also commercially available from Watlow and capable of operating temperatures as high as 300 C and power densities of up to 23.25 W/cm$^2$. Additionally, for example, the heating element can comprise a silicone rubber heater (1.0 mm thick) capable of 1400 W (or power density of 5 W/in$^2$). When an electrical current flows through the filament, power is dissipated as heat, and, therefore, the heating element control unit 532 can, for example, comprise a controllable DC power supply. A further heater option, suitable for lower temperatures and power densities, are Kapton heaters, consisting of a filament embedded in a Kapton (e.g. polyimide) sheet, marketed by Minco, Inc., of Minneapolis, Minn.

Alternatively, for example, the center heating element 533 and the edge heating element 531 can comprise an array of thermo-electric elements capable of heating or cooling a substrate depending upon the direction of electrical current flow through the respective elements. Thus, while the center heating element 533 and the edge heating element 531 are referred to as "heating elements," these elements may include the capability of cooling in order to provide rapid transition between temperatures. Further, heating and cooling functions may be provided by separate elements within the substrate support 530. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the heating element control unit 532 can, for example, comprise a controllable current source.

The one or more cooling elements 521 can comprise at least one of a cooling channel, or a thermo-electric element. Furthermore, as shown in FIG. 12, the one or more cooling elements 521 are coupled to a cooling element control unit 522. Cooling element control unit 522 is configured to provide dependent or independent control of each cooling element 521, and exchange information with controller 550.

For example, the one or more cooling elements 521 can comprise one or more cooling channels that can permit flow of a fluid, such as water, FLUORINERT, GALDEN HT-135, etc., there through in order to provide conductive-convective cooling, wherein the fluid temperature has been lowered via a heat exchanger. The fluid flow rate and fluid temperature can, for example, be set, monitored, adjusted, and controlled by the cooling element control unit 522. Alternately, during heating for example, the fluid temperature of the fluid flow through the one or more cooling elements 521 may be increased to complement the heating by the center heating element 533 and the edge heating element 531. Alternately yet, during cooling for example, the fluid temperature of the fluid flow through the one or more cooling elements 521 may be decreased.

Alternatively, for example, the one or more cooling elements 521 can comprise an array of thermo-electric elements capable of heating or cooling a substrate depending upon the direction of electrical current flow through the respective elements. Thus, while the elements 521 are referred to as "cooling elements," these elements may include the capability of heating in order to provide rapid transition between temperatures. Further, heating and cooling function may be provided by separate elements within the temperature controlled support base 520. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the cooling element control unit 522 can, for example, comprise a controllable current source.

Additionally, as shown in FIG. 12, the substrate holder 500 may further comprise an electrostatic clamp (ESC) comprising one or more clamping electrodes 535 embedded within substrate support 530. The ESC further comprises a high-voltage (HV) DC voltage supply 534 coupled to the clamping electrodes 535 via an electrical connection. The design and implementation of such a clamp is well known to those skilled in the art of electrostatic clamping systems. Furthermore, the HV DC voltage supply 534 is coupled to controller 550 and is configured to exchange information with controller 550.

Furthermore, as shown in FIG. 12, the substrate holder 500 can further comprise a back-side gas supply system 536 for supplying a heat transfer gas, such as an inert gas including helium, argon, xenon, krypton, a process gas, or other gas including oxygen, nitrogen, or hydrogen, to the center region and the edge region of the backside of substrate 510 through two gas supply lines, and at least two of a plurality of orifices and channels (not shown). The backside gas supply system 536, as shown, comprises a two-zone (center/edge) system, wherein the backside pressure can be varied in a radial direction from the center to edge. Furthermore, the backside gas supply system 536 is coupled to controller 550 and is configured to exchange information with controller 550.

Further yet, as shown in FIG. 12, the substrate holder 500 further comprises a center temperature sensor 562 for measuring a temperature at a substantially center region below substrate 510 and an edge temperature sensor 564 for measuring a temperature at a substantially edge region below substrate 510. The center and edge temperature sensors 562, 564 are coupled to a temperature monitoring system 560.

The temperature sensor can include an optical fiber thermometer, an optical pyrometer, a band-edge temperature measurement system as described in U.S. Pat. No. 6,891,124, the contents of which are incorporated herein by reference in their entirety, or a thermocouple (as indicated by the dashed line) such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

The temperature monitoring system 560 may provide sensor information to controller 550 in order to adjust at least one of a heating element, a cooling element, a backside gas supply system, or an HV DC voltage supply for an ESC before, during, or after processing.

Controller 550 includes a microprocessor, memory, and a digital I/O port (potentially including D/A and/or A/D converters) capable of generating control voltages sufficient to communicate and activate inputs to substrate holder 500 as well as monitor outputs from substrate holder 500. As shown in FIG. 12, controller 550 can be coupled to and exchange information with heating element control unit 532, cooling element control unit 522, HV DC voltage supply 534, backside gas supply system 536, and temperature monitoring system 560. A program stored in the memory is utilized to interact with the aforementioned components of substrate holder 500 according to a stored process recipe.

The controller 550 may also be implemented as a general purpose computer, processor, digital signal processor, etc., which causes a substrate holder to perform a portion or all of the processing steps of the invention in response to the controller 550 executing one or more sequences of one or more instructions contained in a computer readable medium. The computer readable medium or memory is configured to hold instructions programmed according to the teachings of the invention and can contain data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 550 may be locally located relative to the substrate holder 500, or it may be remotely located relative to the substrate holder 500 via an internet or intranet. Thus, controller 550 can exchange data with the substrate holder 500 using at least one of a direct connection, an intranet, or the internet. Controller 550 may be coupled to an intranet at a customer site (i.e., a device maker, etc.), or coupled to an intranet at a vendor site (i.e., an equipment manufacturer). Furthermore, another computer (i.e., controller, server, etc.) can access controller 550 to exchange data via at least one of a direct connection, an intranet, or the internet.

Optionally, substrate holder 500 can include an electrode through which RF power is coupled to plasma in a processing region above substrate 510. For example, support base 520 can be electrically biased at an RF voltage via the transmission of RF power from an RF generator through an impedance match network to substrate holder 500. The RF bias can serve to heat electrons to form and maintain plasma, or bias substrate 510 in order to control ion energy incident on substrate 510, or both. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, an impedance match network can serve to maximize the transfer of RF power to plasma in the processing chamber by minimizing the reflected power. Various match network topologies (e.g., L-type, pi-type, T-type, etc.) and automatic control methods can be utilized.

Additional details for the design of a temperature controlled substrate holder configured for rapid and uniform control of substrate temperature are provided in U.S. Patent Application Publication No. 2008/0083723; U.S. Patent Application Publication No. 2010/0078424; U.S. Patent Application Publication No. 2008/0083724; U.S. Patent Application Publication No. 2008/0073335; U.S. Pat. No. 7,297,894; U.S. Pat. No. 7,557,328; and U.S. Patent Application Publication No. 2009/0266809.

In one embodiment, the plasma etch process may comprise a process parameter space that includes: a chamber pressure ranging up to about 1000 mTorr (milli-Torr) (e.g., up to about 200 mTorr, or up to about 30 to 60 mTorr), a process gas flow rate ranging up to about 2000 sccm (standard cubic centimeters per minute) (e.g., up to about 1000 sccm, or about 1 sccm to about 100 sccm, or about 10 sccm to about 50 sccm, or about 30 sccm), an additive gas flow rate ranging up to about 2000 sccm (e.g., up to about 1000 sccm, or about 1 sccm to about 20 sccm, or about 5 sccm), an upper electrode (e.g., element 70 in FIG. 6) RF bias ranging up to about 2000 W (watts) (e.g., up to about 1000 W, or up to about 500 W), and a lower electrode (e.g., element 22 in FIG. 6) RF bias ranging up to about 1000 W (e.g., up to about 500 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another alternate embodiment, RF power is supplied to the upper electrode and not the lower electrode. In another alternate embodiment, RF power is supplied to the lower electrode and not the upper electrode. In alternate embodiments, RF power and/or DC power may be coupled in any of the manners described in FIGS. 4 through 11.

The time duration to perform a plasma etch process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with endpoint detection.

The plasma etch process described above may be performed utilizing a plasma etching system such as the one described in FIGS. 4 through 11. Furthermore, the plasma etch process described above may be performed utilizing a temperature controlled substrate holder in a plasma etching system such as the one described in FIG. 12. However, the methods discussed are not to be limited in scope by this exemplary presentation.

Figure 13:
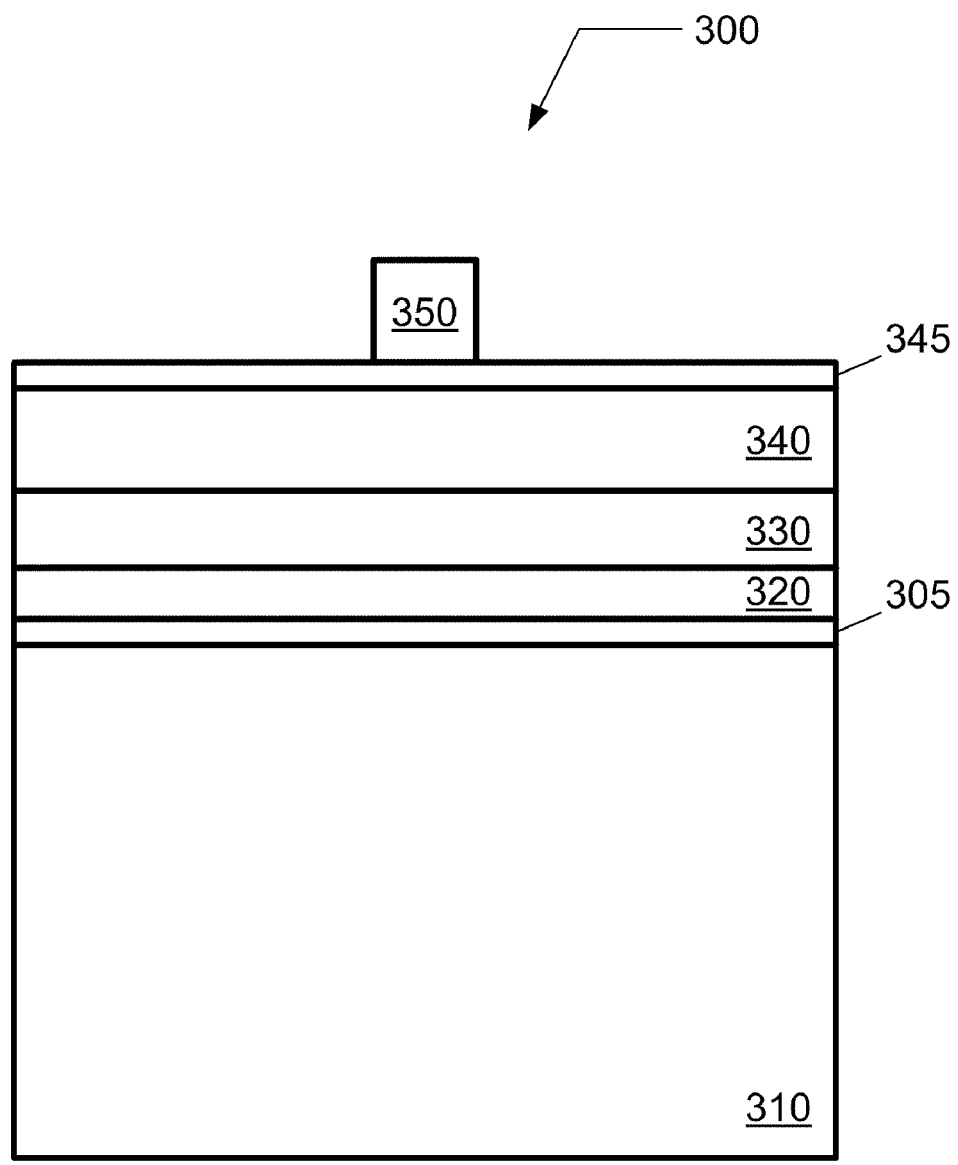
FIG. 13 provides a schematic illustration of a film stack according to another embodiment.
Figures 14A, 14B:
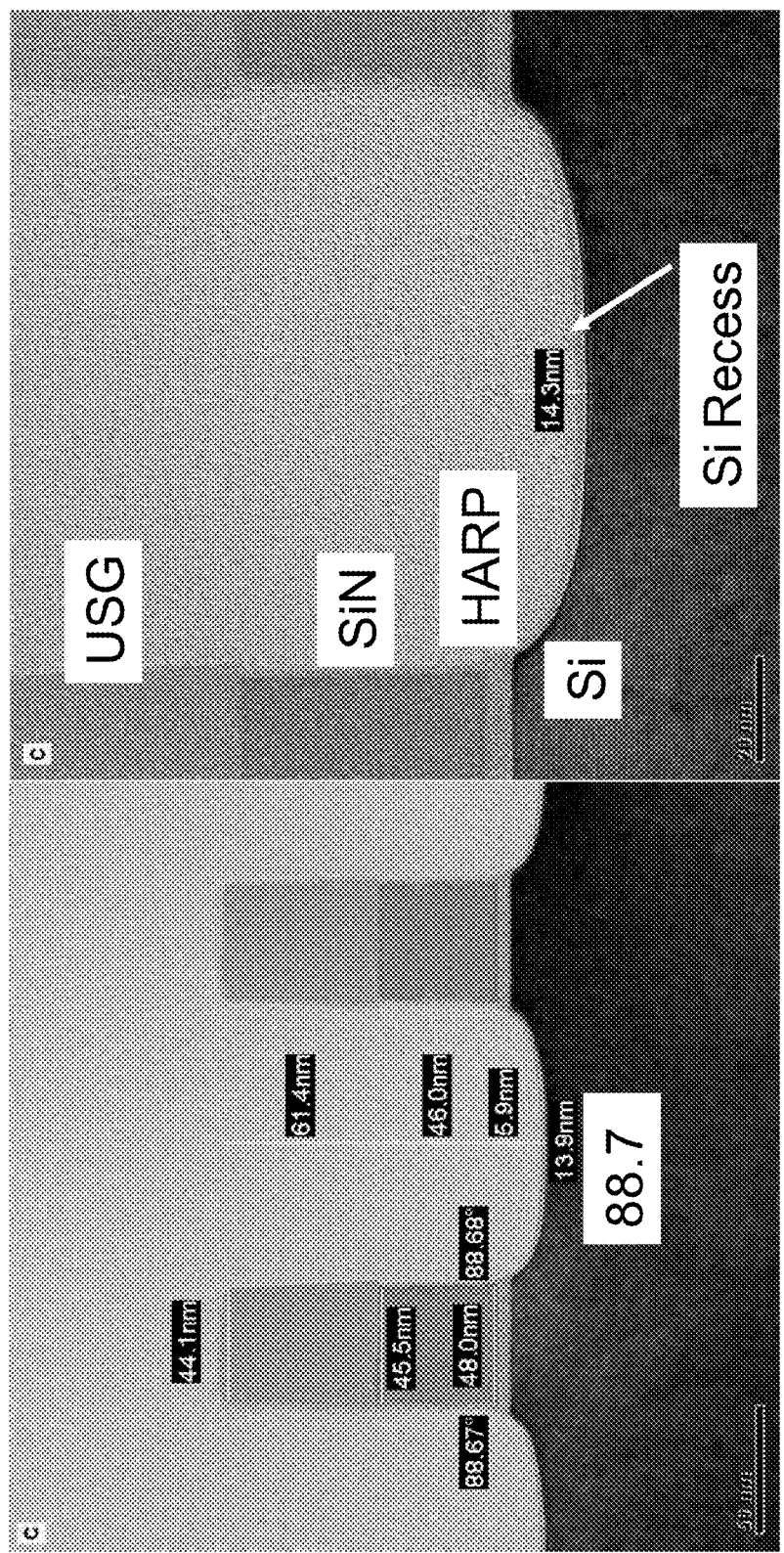
FIGS. 14A through 14D provide a SEM photograph of a patterning result using a plasma etch process.
Figures 14C, 14D:
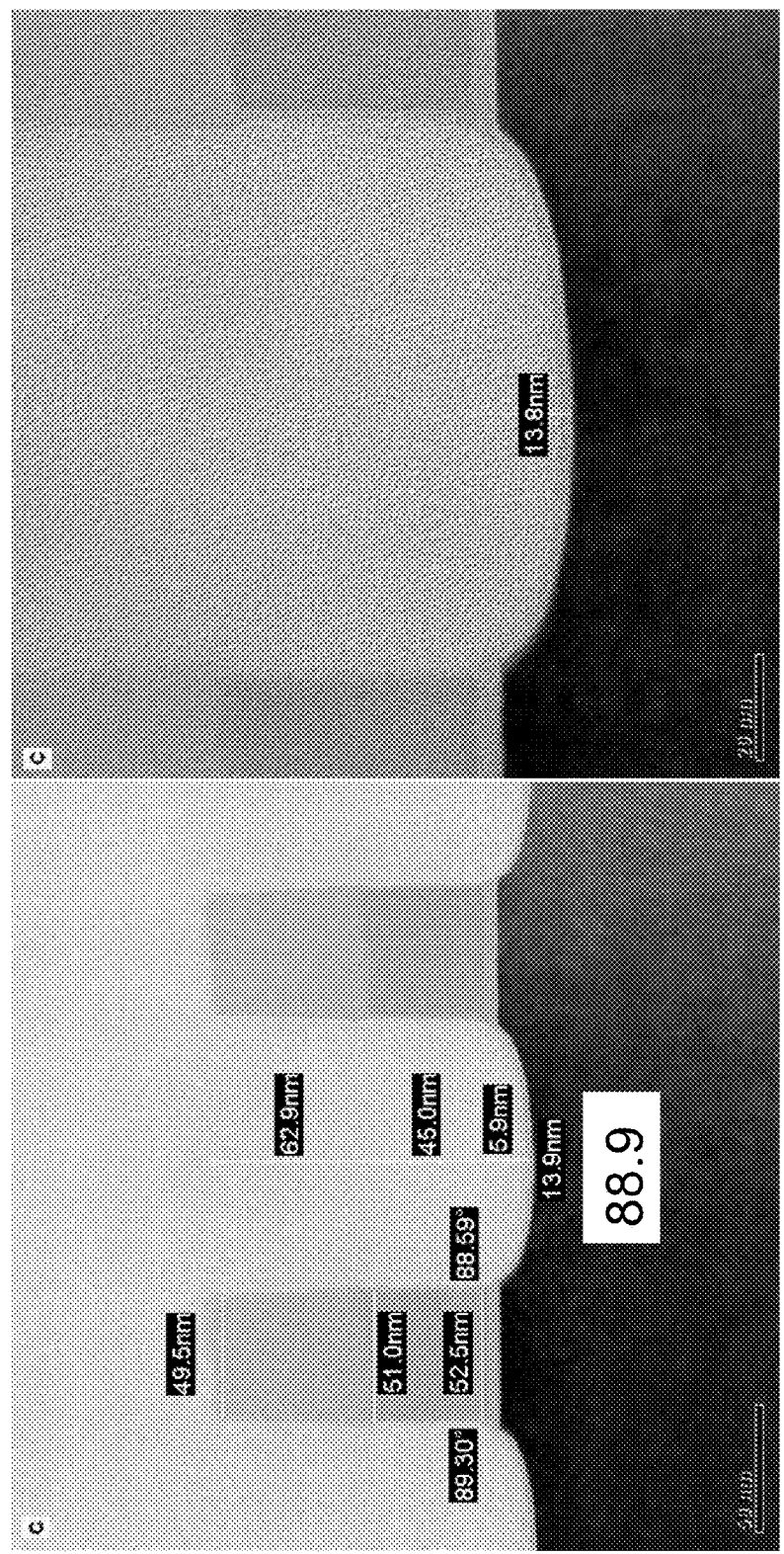

As noted above, the present inventors discovered that using a balance of process gas containing C, H and F, and an additive gas containing $CO_2$ may achieve an anisotropic etch profile with reduced silicon recess. FIG. 13 provides a schematic illustration of a film stack 300 to be patterned using the plasma etch process described above. The film stack 300 comprises substrate 310, high aspect ratio process (HARP) oxide layer 305, silicon nitride layer 320, un-doped silicate glass (USG) layer 330, organic dielectric layer (ODL) 340, silicon-containing anti-reflective coating (SiARC) layer 345, and patterned photo-resist layer 350. The patterned photo-resist layer 350 may be prepared using conventional lithographic techniques known to those skilled in the art of pattern etching.

The layers in film stack 300 are patterned using a series of etching steps. Table 1 provides three exemplary process conditions for patterning the silicon nitride layer 320. For each plasma etch process, a process condition is recited including a process no., an upper electrode (UEL) power (watts, W), a lower electrode (LEL) power (watts, W), a gas pressure (milli-Torr, mTorr) in the plasma etching system, a temperature set for components in the plasma etching system (° C.) ("LEL"=Lower electrode temperature, i.e., substrate temperature, at the center "LEL-C" and edge "LEL-E"), a $CF_4$ flow rate (standard cubic centimeters per minute, sccm), an $CHF_3$ flow rate, a $CO_2$ flow rate, an Ar flow rate, an $O_2$ flow rate, and etch time (sec, seconds).

TABLE 2

| Process Number | Center recess (nm) | Edge recess (nm) | Center profile (degrees) | Edge profile (degrees) |
|---|---|---|---|---|
| 1 | 14.3 | 13.8 | 88.7 | 88.9 |
| 2 | 4.8 | 4.8 | 86.3 | 87 |
| 3 | 7.1 | 7.1 | 89.5 | 89 |

Figures 15A, 15B:
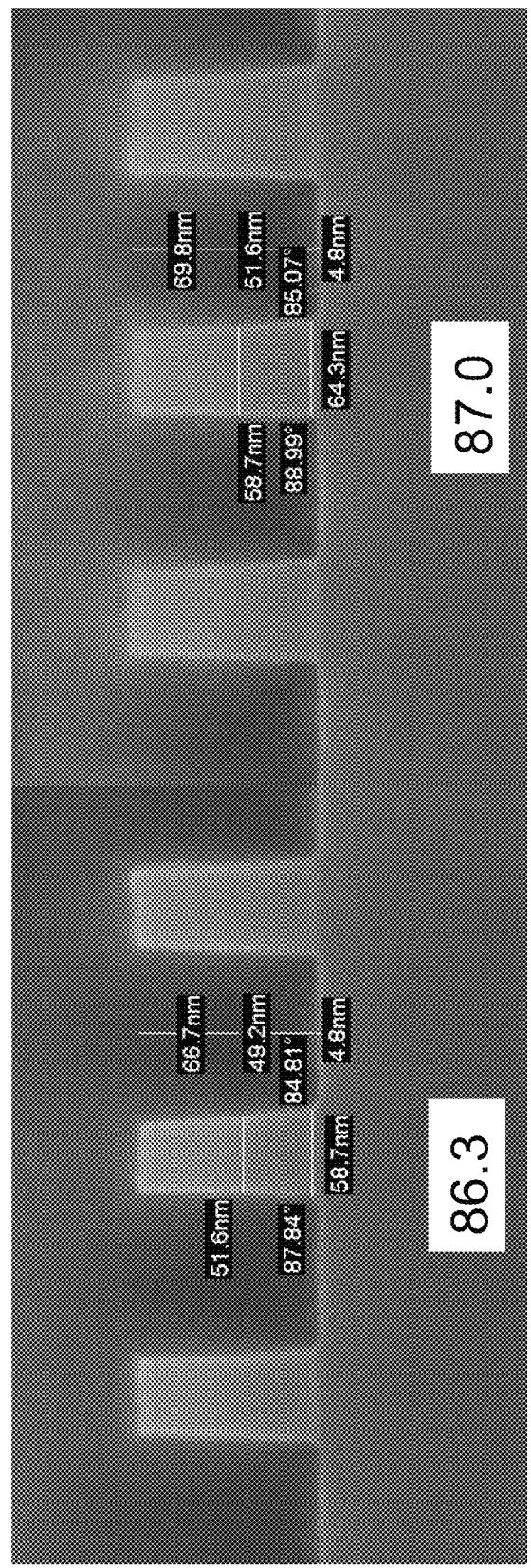
FIGS. 15A and 15B provide a SEM photograph of a patterning result using a plasma etch process according to an embodiment.
Figures 16A, 16B:
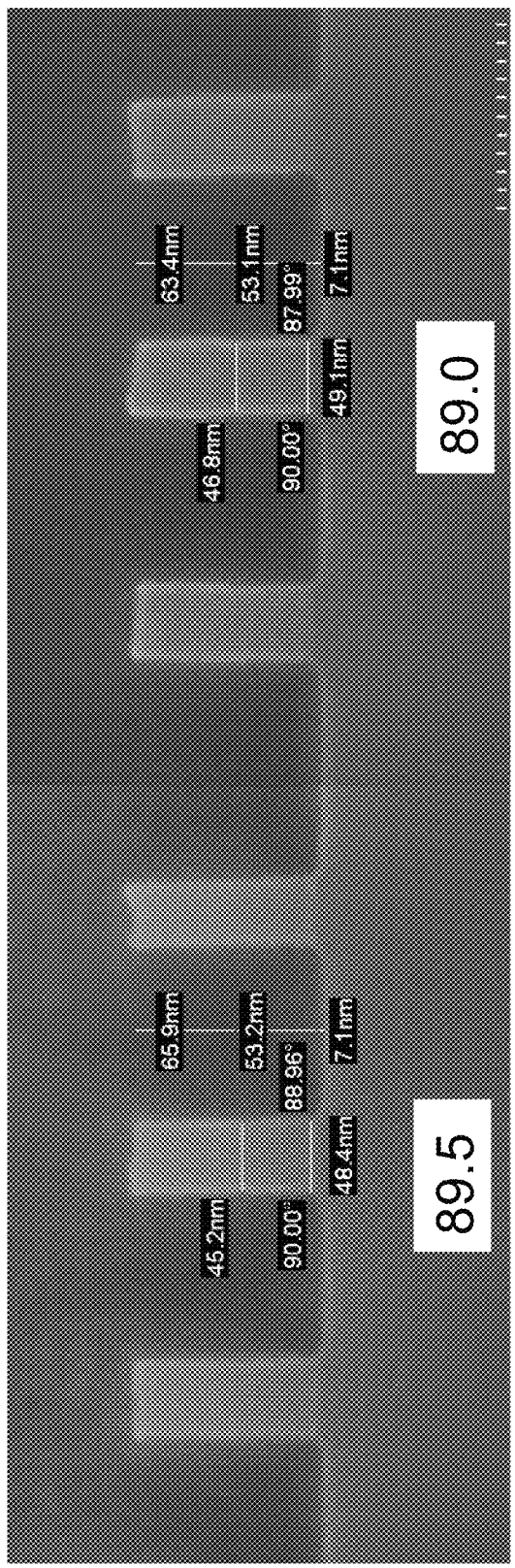
FIGS. 16A and 16B provide a SEM photograph of a patterning result using a plasma etch process according to yet another embodiment.

FIGS. 14A through 14D provide SEM (scanning electron microscope) photographs of the patterned silicon nitride layer and an exploded view of the recess at the center and the edge of the substrate, respectively, for process number 1 ($CF_4$/$CHF_3$/$O_2$ plasma chemistry). FIGS. 15A and 15B provide SEM photographs of the patterned silicon nitride layer at the center and the edge of the substrate, respectively, for process number 2 ($CHF_3$/Ar plasma chemistry). FIGS. 16A and 16B provide SEM photographs of the patterned silicon nitride layer at the center and the edge of the substrate, respectively, for process number 3 ($CHF_3$/Ar/$CO_2$ plasma chemistry). Table 2 summarizes the results for the three plasma etch processes and provides the silicon recess (nanometers, m) and the sidewall angle.

As evident in FIGS. 14 through 16 and Table 2, the use of $CHF_3$ alone with a noble gas improves the silicon recess, i.e., reduces the silicon recess; however, the etch anisotropy deteriorates, i.e., sidewall angle decreases from 90 degrees, or angular deviation increases. When $CO_2$ is introduced in process number 3 to the $CHF_3$ only condition, the etch anisotropy is improved, i.e., commensurate with that of process number 1, while at the expense of silicon recess. Yet, the silicon recess is reduced from process number 1.

Although only certain embodiments of this invention have been described in detail above, those skilled in the art will readily appreciate that many modifications are possible in the embodiments without materially departing from the novel teachings and advantages of this invention. For example, although one exemplary process flow is provided for preparing a spacer structure, other process flows are contemplated. Accordingly, all such modifications are intended to be included within the scope of this invention.

TABLE 1

| Process Number | UEL RF (W) | LEL RF (W) | p (mTorr) | T (° C.) (LEL-C, LEL-E) | He Pressure (Torr) (LEL-C, LEL-E) | $CF_4$ (sccm) | $CHF_3$ (sccm) | $CO_2$ (sccm) | Ar (sccm) | $O_2$ (sccm) | Etch time (sec) |
|---|---|---|---|---|---|---|---|---|---|---|---|
| 1 | 600 | 100 | 40 | 40, 25 | 20, 30 | 50 | 50 | | | 5 | 180 |
| 2 | 250 | 300 | 40 | 60, 60 | 20, 30 | | 28 | | 1500 | | 180 |
| 3 | 250 | 300 | 40 | 60, 60 | 20, 30 | | 28 | 5 | 1500 | | 180 |

The invention claimed is:

1. A method for selectively etching a substrate, comprising:
disposing a substrate comprising a silicon nitride ($SiN_y$) layer overlying silicon in a plasma etching system;
transferring a pattern to said silicon nitride layer using a plasma etch process, wherein said plasma etch process utilizes a process gas composition having as incipient ingredients a process gas containing C, H and F, and an additive gas including $CO_2$; and
selecting an amount of said additive gas in said plasma etch process to achieve: (1) a silicon recess formed in said silicon having a depth less than 10 nanometers (nm), and (2) a sidewall profile in said pattern having an angular deviation from 90 degrees less than 2 degrees.

2. The method of claim 1, further comprising:
extending said plasma etch process by an over-etch period of time to uniformly transfer said pattern to said silicon nitride layer on said substrate.

3. The method of claim 1, wherein said process gas containing C, H and F comprises $CHF_3$, $CH_3F$, or $CH_2F_2$, or any combination of two or more thereof.

4. The method of claim 1, wherein said process gas containing C, H and F consists of $CHF_3$.

5. The method of claim 1, wherein said process gas composition further comprises a noble gas.

6. The method of claim 1, wherein said process gas composition further comprises an oxygen containing gas, said oxygen containing gas comprises oxygen ($O_2$), CO, NO, $N_2O$, or $NO_2$, or any combination thereof.

7. The method of claim 1, wherein said process gas composition consists of $CHF_3$, $CO_2$, and Ar.

8. The method of claim 1, wherein said silicon recess is less than 8 nm.

9. The method of claim 1, wherein said angular deviation is less than 1 degree.

10. The method of claim 1, wherein said plasma etch process includes setting a pressure in said plasma etching system ranging from 30 mTorr to 60 mTorr.

11. The method of claim 1, wherein a flow rate of said process gas containing C, H and F ranges from about 10 sccm to about 50 sccm.

12. The method of claim 1, wherein a flow rate of said additive gas ranges from about 1 sccm to about 10 sccm.

13. The method of claim 1, wherein said plasma etch process includes coupling first radio frequency (RF) power at a first frequency to a substrate holder upon which said substrate rests in said plasma etching system, and coupling second radio frequency (RF) power at a second frequency to an upper electrode opposing said substrate on said substrate holder.

14. The method of claim 13, wherein said first radio frequency (RF) power ranges up to 500 W, and said second radio frequency (RF) power ranges up to 500 W.

15. The method of claim 1, wherein a ratio between a flow rate of said additive gas and a flow rate of said process gas containing C, H and F ranges from 5% to 25%.

16. The method of claim 1, wherein a ratio between a flow rate of said additive gas and a flow rate of said process gas containing C, H and F ranges from 15% to 20%.

17. The method of claim 1, wherein said process gas containing C, H and F consists of $CHF_3$, and wherein a ratio between a flow rate of said $CO_2$ and a flow rate of said $CHF_3$ ranges from 15% to 20%.

18. The method of claim 1, wherein said substrate rest on a temperature controlled substrate holder in said plasma etching system, said temperature controlled substrate holder comprises:
a support base having fluid channels to circulate a temperature controlled thermal fluid in said support base; and
a substrate support coupled via a thermal insulator to an upper portion of said support base, said substrate support comprising:
one or more heating elements embedded within said substrate support,
an upper surface to support said substrate by contact between said upper surface and a backside of said substrate, and
an electrostatic clamp electrode to hold said substrate on said upper surface of said substrate support.

19. The method of claim 18, wherein said temperature controlled substrate holder further comprises:
a backside gas supply system configured to supply a heat transfer gas to the backside of said substrate through at least one of a plurality of orifices or channels disposed on said upper surface of said substrate support, wherein said plurality of orifices of said backside gas supply system are arranged in a plurality of zones on said upper surface of said substrate support to vary a backside pressure in a radial direction between a substantially central region of the backside of said substrate and a substantially edge region of the backside of said substrate.

20. The method of claim 1, wherein said silicon nitride layer is part of an insulation spacer for a transistor gate.

* * * * *